United States Patent
Kunz et al.

(10) Patent No.: US 6,875,468 B2
(45) Date of Patent: Apr. 5, 2005

(54) METHOD AND DEVICE FOR TREATING AND/OR COATING A SURFACE OF AN OBJECT

(75) Inventors: Thomas Kunz, Alzenau (DE); Hilmar Von Campe, Bad Homburg (DE)

(73) Assignee: RWE Solar GmbH, Alzenau (DE)

( * ) Notice: Subject to any disclaimer, the term of this patent is extended or adjusted under 35 U.S.C. 154(b) by 270 days.

(21) Appl. No.: 10/113,831

(22) Filed: Apr. 2, 2002

(65) Prior Publication Data

US 2002/0160627 A1 Oct. 31, 2002

(30) Foreign Application Priority Data

Apr. 6, 2001 (DE) .......................................... 101 17 416
Sep. 9, 2001 (DE) .......................................... 101 43 587

(51) Int. Cl.[7] .............................................. C23C 16/00
(52) U.S. Cl. ............................. 427/255.28; 427/248.1; 427/255.23
(58) Field of Search ....................... 427/248.1, 255.23, 427/255.28, 255.26, 255.27; 216/58, 73, 74, 79; 118/715, 728

(56) References Cited

U.S. PATENT DOCUMENTS

| 4,352,713 | A | * | 10/1982 | Morita ..................... 427/248.1 |
| 4,597,986 | A | * | 7/1986 | Scapple et al. ............. 427/582 |
| 4,999,215 | A | * | 3/1991 | Akagi et al. ................ 427/488 |
| 6,265,353 | B1 | * | 7/2001 | Kinder et al. ............... 505/238 |

OTHER PUBLICATIONS

Chemical Vapor Deposition for Microelectronics, Arthur Sherman, Noyes Publications, USA pp. 31–39 and 150–174.

* cited by examiner

*Primary Examiner*—Timothy Meeks
*Assistant Examiner*—Eric B. Fuller
(74) *Attorney, Agent, or Firm*—Dennison, Schultz, Dougherty & MacDonald

(57) ABSTRACT

Method for treating and/or coating a surface of an object, especially for coating a surface of a substrate such as a semiconductor component or solar cell, in which the surface is supplied with a gas that contains particles that will interact and/or react with the surface, forming a coating thereon. The surface of the object is oriented at an angle α from the vertical, and the gas is directed toward the surface such that it flows along the object by force of convection, starting from the base area of the surface of the object.

27 Claims, 4 Drawing Sheets

METHOD AND DEVICE FOR TREATING AND/OR COATING A SURFACE OF AN OBJECT

BACKGROUND OF THE INVENTION

The invention relates to a method for treating and/or coating a surface of an object, especially a surface of a substrate, such as a semiconductor component or solar cell, wherein the surface is supplied with a gas that contains particles that will interact with the surface. The invention further relates to a device for coating and/or treating a surface of an object, such as a substrate, by supplying said substrate with a gas that contains particles for coating and/or treatment, with the device comprising a chamber that is formed by a top panel, a base panel and side panels of the surface to be coated and/or treated, and a longitudinal boundary panel that extends parallel or approximately parallel to said surface; the device further comprises a gas intake and a gas outlet port, and at least one heat source for heating the surface.

In coating substrates and/or surfaces via a CVD process (chemical vapor deposition), various principles of application may be used. It is possible, for instance, to direct the gas flow parallel to the surface of the substrate. In this, the substrate may be fixed or in motion. Directing the gas along the surface of the substrate creates a tendency toward a rapid depletion of the carrier gas. Furthermore, if the substrate is fixed, inhomogeneous deposition rates, inhomogeneous coating thicknesses, and uneven doping in the direction of the thickness and surface of the coating may result.

If the substrate is in motion, although a homogeneous coating thickness can be achieved, the deposition rate will be inhomogeneous. An uneven doping in the direction of coating thickness may also result.

In plug flow reactors, the gas that is to be supplied to a substrate surface flows perpendicular from above toward the surface that is to be coated. If the surfaces of the substrate are small, a homogeneous deposition rate can be achieved. Coating thickness and doping in the direction of the thickness and the surface of the coating are also homogeneous. However, if larger surfaces are to be coated, recycling the reactive gas becomes problematic, hence in plug flow reactors, positive results can be achieved only with relatively small substrate surfaces.

To produce homogeneous deposits over large surfaces, pancake reactors, which are similar in principle to the plug flow reactor, are used. In a pancake reactor, the surface to be coated is acted upon by the gas in a vertical position. The substrate itself is placed on a hot susceptor; the convection in the gas atmosphere that this creates results in a thorough mixing and homogenization of the gas. Accordingly, homogeneous deposition rates, homogeneous coating thicknesses, and homogeneous doping in the direction of the coating thickness and the coating surface are thus achieved. Homogeneity can be further increased by rotating the susceptor during the coating process. Even if such a coating process is suitable for use on large surfaces, and creates reproducible, high-quality epitaxial coatings, it must still be considered a disadvantage that the gas is introduced from the center of the system through a boring in the plate-shaped susceptor, and thus remains limited in its application to wafer coating.

Corresponding methods and/or reactors that are used in application are found in the source US-Z: Chemical Vapor Deposition for Microelectronics, Arthur Sherman, Noyes Publications, USA, pp 31–39, 150–174.

The process of rotating the substrate being coated in order to achieve adequate homogeneity in terms of coating thickness is known in the art; this process allows the inhomogeneities to be worked out in an azimuthal direction. With CVD processes in the field of semiconductors, substrates are thus rotated or at least placed in motion. In this, rotation presupposes rotationally symmetrical substrates, substrate carriers, and/or susceptors with precisely defined shapes and a suitable mass distribution ratio.

In the techniques described above, used with a horizontal CVD reactor, a plug flow reactor, or a pancake reactor, the substrate is ordinarily placed on a susceptor, which is heated either inductively or via lamps. If the gas that will interact with the substrate—frequently referred to as nutrient gas—is above said substrate, then the deposition of the coating, and thus the quality of the coating, will be influenced by the convection of the gas caused by the heating of the substrate. In this, the convection may be quite turbulent and irregular. In addition, if the hot gas comes into contact with the cold gas flowing in, then condensation and/or nucleation may occur in the gas phase, which will create mist or powder. Powdery deposits on the coating, however, will produce defects in a growing CVD layer. Furthermore, particles can result in defects, which must be prevented, especially in semiconductor and solar technology.

SUMMARY OF THE INVENTION

The object of the present invention is to develop a method and a device of the type described at the beginning that will allow adequate surface and/or spatial homogeneity of the area of the surface that is to be treated, or of the coating to be applied to the surface, to be achieved. A further object of the invention is to provide a high level of efficiency in the coating of the surface, i.e. an adequate ratio of coating rate to gas flow. In addition, a well-calculated gas direction and gas flow are to be ensured via simple means.

The object is attained in accordance with the invention with a method of the type described at the beginning, in that the surface of the object is oriented at an angle $\alpha$ from vertical, wherein $0° \leq \alpha < 90°$, and in that the gas is directed such that it flows beginning from the base area of the surface of the object, and along said object by force of convection. The surface of the object is preferably tilted at an angle $\alpha$ from vertical, wherein $30° \leq \alpha \leq 60°$. Furthermore, the gas is heated and directed along the surface of the object such that a laminar or essentially laminar flow is created.

The surface of the object preferably forms a boundary surface in a preferably cuboid chamber, formed by a longitudinal boundary panel which extends parallel to the surface, a base panel, a top panel, and side panels; gas is introduced into the chamber in the area of the top panel and is directed along the longitudinal boundary panel and the base panel, during which process it is heated. Hence the gas that enters the chamber flows first along the longitudinal boundary panel, by force of gravity, in order to be directed along the base panel and heated at least by the surface to be treated and/or coated, with the result that the gas will flow along the surface by force of convection. In this, a portion of the gas that flows directly against the surface of the object is drawn out of the chamber, and the remaining portion is recycled within the chamber. With this system, the portion of the gas that has become depleted in terms of the particles that interact with the surface is removed from the chamber, referred to as the reaction chamber. The portion of the gas that is removed from the reaction chamber preferably possesses a coating thickness that is less than three times the thickness of the diffusion zone in which gas particles will interact with the surface of the object. The other portion of the gas, flowing in a laminar flow along the surface of the object, the particles of which have not yet interacted with the surface, can be recycled within the chamber, without any uncontrolled change in concentration. The used gas that is drawn out of the chamber is replaced with new, cold gas, which is preferably added to the circulating gas via a slit-shaped port. To ensure that the recycled partial gas flow will also "drop" by force of gravity along the longitudinal boundary panel of the chamber, which extends along or basically parallel to the surface of the object, the recycled gas is mixed with colder, fresh gas and/or the longitudinal boundary panel is cooled.

With the teaching of the present invention, the disadvantages of the current state of the art are avoided, while at the same time considerable advantages are achieved: These include the removal of used gas from the reaction chamber immediately following reaction, and the improved exploitation of the unused portion of the gas via recycling; a further advantage is the homogeneity of the deposition rate with a non-rotating substrate.

In comparison with methods in which the gas flow is directed horizontally toward a non-rotating substrate surface, with a deposited layer a more homogeneous deposition rate and thus a more homogeneous coating thickness and doping are achieved. In comparison with known methods in which the substrate is rotated, a more homogeneous doping of the deposited coatings is achieved. Furthermore, the structural cost is lower since no rotation of the substrate is necessary. In comparison with plug flow reactors, this system offers the advantage that deposition over large substrate surfaces is more homogeneous in terms of deposition rate, coating thickness, and doping.

Based upon the teaching of the invention, and the utilization of a convection current, rectangular reactor geometries, and thus rectangular substrate surfaces, which are necessary e.g. in thin-film technology, in photovoltaics, and in the production of large TFT display screens, can be used.

While in a pancake reactor the hot substrate surface is positioned at the bottom, allowing small dust particles to be deposited by force of gravity, thus resulting in growth flaws in the coating, this is excluded by the teaching of the invention with the positioning of the object above the gas.

The surface of the object itself may be heated, for example, via infrared lamps, microwaves, and/or inductively, to such an extent that the object will give off enough heat to the gas flowing along its surface to create a convection current.

Furthermore, in creating the convection current inside the chamber, a zone of lower flow speed is also created, the width of which corresponds approximately to the surface to be treated and/or coated, thus contributing to the homogeneity of the surface to be treated and/or the coating to be formed on said surface.

It is further possible for the object to be in motion, parallel to the gas which is in a laminar flow along the surface to be treated and/or coated; this allows surfaces to be treated and/or coated in a continuous operation, even if the surface area of the object is greater than the surface that is directly exposed to the gas.

In a further development of the invention, in order to deposit a coating containing silicon carbide and/or silicon nitride on the object, a gas mixture of $CH_3SiCl_3$ and $H_2$ and/or $NH_3$ or $SiH_2Cl_2$, $SiHCl_3$, $SiCl_4$ and $H_2$ and/or $NH_3$ that will react with the surface is used.

To deposit a silicon coating, a gas mixture of $SiHCl_3$ and $H_2$ is used. It is also possible to admix a doping gas, comprised, for example, of diborane and/or boron trichloride or aluminum trichloride or gallium chloride or indium chloride, to the gas mixture being used.

To form a $CuInGaSe_2$ coating on a glass substrate, a Cu, In, Ga-coating deposited on a glass substrate is supplied with gas containing $H_2Se$.

To deposit a tin oxide coating, according to the invention, a glass substrate is supplied with a gas mixture comprised of tin(IV)-chloride and $H_2O$ vapor, at temperatures of 400° C. to 550° C. To deposit a silicon oxide coating, according to the invention, a silicon substrate or Si-coated substrate, or a $p^+$-Si nucleation layer is supplied with a gas mixture comprised of $SiCl_4$ and $H_2O$ vapor, at temperatures of 400° C. to 600° C.

According to a further proposal of the invention, a layer of phosphorous glass is formed by supplying a silicon layer with gas containing $POCl_3$. The phosphorous glass layer obtained in this manner is tempered for the diffusion of phosphorous. The result is a homogeneous silicon coating doped with phosphorous.

In addition to the formation of coatings, the teaching of the invention also applies to the treatment of surfaces and the removal of coatings on said surfaces. For instance, a coating on the surface of an object can be removed by a flow of HF-gas along the surface. A silicon oxide film, which is created in the production of thin-film solar cells and must afterward be removed, can be removed evenly, for example, via a flow of HF-gas along the surface. A silicon oxide film can also be evenly removed with air containing HF and/or $H_2O$ vapor, which flows parallel to the silicon oxide film and will react with it. Finally, a silicon oxide film can be reduced and thereby removed via a flow of gas containing $H_2$ along the film, at a temperature $T_3$, wherein $T_3 \geq 1000°$ C.

A device for coating and/or treating a surface of an object, such as a substrate, by suppling said surface with a a gas that contains particles necessary to the coating and/or treatment, of the type described at the beginning, is characterized in that the surface of the object to be treated and/or coated forms a boundary surface of the chamber, and extends at an angle from vertical $\alpha$, wherein $0° \leq \alpha < 90°$; in that the gas intake and outlet ports are positioned at the top of the chamber; and in that the gas can be directed along the surface of the object as it flows through the chamber, by force of convection. The invention provides especially that the gas in the chamber can be directed by force of gravity and convection such that the gas will flow in a laminar or essentially laminar flow along the surface of the object.

The gas outlet port should extend over or nearly over the entire width of the surface, and should be oriented parallel to said surface; in other words, it should be shaped like a slot. According to a preferred embodiment of the invention, the width of the slot of the gas outlet port is preferably d, wherein $d \leq 3$ D, with D representing the width of the diffusion zone of the elements in the gas that interact with the surface. It is especially provided that the distance $d \approx D$.

The gas intake port is preferably positioned in the area of the longitudinal boundary panel, which extends parallel or approximately parallel to the surface of the object; a slot-shaped design for this port is also preferred.

The surface of the object, the longitudinal boundary panel, and the top and base panels, which preferably extend perpendicular to said longitudinal boundary panel, are oriented relative to one another and/or the method of heating is designed such that the gas flowing within the chamber will create a convection current.

It is further provided that the surface of the object to be treated and/or coated very securely seals an opening in the chamber. Furthermore, the pressure inside the chamber may be slightly higher than that of the surrounding atmosphere, in order to exclude any penetration of gas.

To produce a system of semiconducting layers using the device specified in the invention, the invention is characterized by the following procedural steps:

Deposition via CVD of a coating containing SiC and/or silicon nitride on a substrate comprised, for example, of silicon, ceramic, or graphite, at a substrate temperature T, wherein $900°\ C. \leq T \leq 2000°\ C.$, preferably $1200°\ C. \leq T \leq 1600°\ C.$, in the chamber, Formation in the chamber of a silicon film ($p^+$) doped with an element from Group III of the periodic table, Crystallization of the doped silicon film by melting it on (outside the chamber if necessary), and Epitaxy of the multicrystalline silicon film (p), which is doped with an element from Group III, with particles measuring 0.1 to 10 mm and a photosensitive silicon film (p-film).

In addition, an n-doped film, an electrically conductive face contact layer and/or an antireflective coating can be applied to a correspondingly produced system of layers, wherein both the final layer and the antireflective coating can be produced inside the chamber.

Furthermore, a 0.1 to 5 µm, preferably 1 to 2 µm thick silicon oxide film can be created on the $p^-$ film prior to its crystallization, allowing the $p^-$ film to be melted on, and then recrystallized in particular following the zone melting process; after crystallization the oxide layer is removed using a gas containing HF and/or $H_2O$, revealing a nucleation layer having a multicrystalline structure, with particles measuring 0.1 to 10 mm, onto which the p-film will be epitaxially deposited.

BRIEF DESCRIPTION OF THE DRAWINGS

Further details, advantages, and characteristic features of the invention are found not only in the claims, and in the characteristic features found therein—alone and/or in combination—, but also in the following description of the preferred exemplary embodiments illustrated in the drawings.

These show.

DETAILED DESCRIPTION OF THE PREFERRED EMBODIMENTS

The teaching of the invention with respect to the coating and/or treating of surfaces of objects, especially substrate surfaces, follows as illustrated in the figures in the diagrams. The embodiments in the figures involve primarily the process of depositing silicon. This is not intended, however, to restrict the teaching of the invention to this one process. In addition to depositing materials, a chemical or physical change in an existing layer can also be effected, such as can be implemented, for example, in drying processes. A chemical transformation of an existing layer can also be realized with the method specified in the invention.

The principle characterizing feature of the invention is that a gas containing elements that will interact with a surface to be treated and/or coated is directed within a chamber—hereinafter referred to as the reactor chamber—such that the gas, also referred to as the carrier gas or nutrient gas, is moved by force of convection along the surface, creating a laminar flow.

Figure 1:
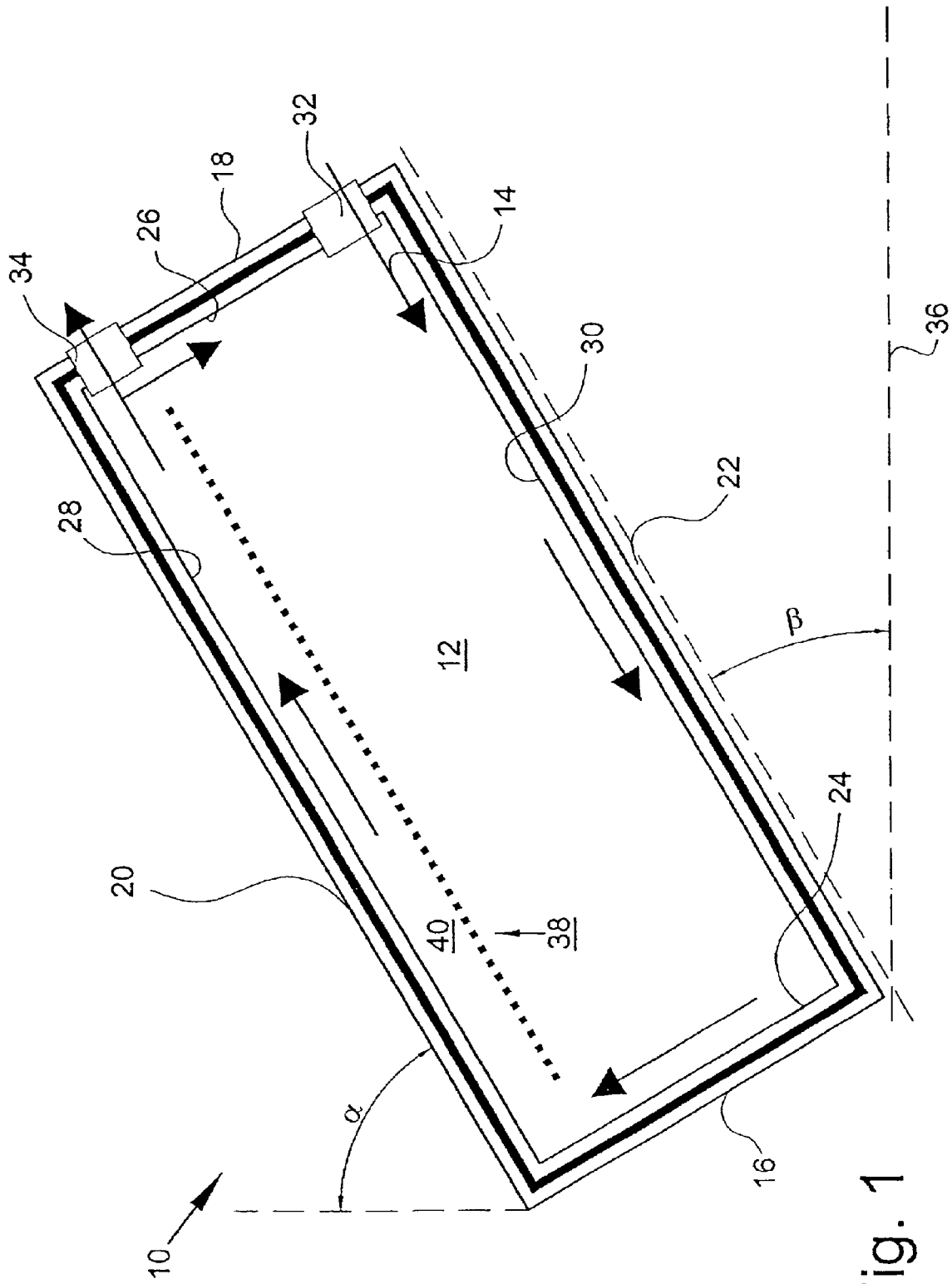
FIG. 1 a basic sketch of a device for treating and/or coating a surface of an object, FIGS. 2a and b the device shown in FIG. 1, in different orientations from vertical, FIG. 3 a further basic sketch of a device as shown in FIG. 1, FIG. 4 a graphic representation of the rate of deposition on a surface, as a function of its angle of inclination, and FIG. 5 a c-Si thin-film solar cell.

In FIG. 1, a device 10 in the form of a reactor is illustrated purely in principle; a gas is fed into the inner chamber 12 of this device, flowing in the direction of the arrows 14. The reactor 10 is formed by a base panel 16, a top panel 18, a carrier panel 20, and a longitudinal side panel 22 that extends parallel or nearly parallel to said carrier panel, in addition to side panels which are not illustrated here. The carrier panel 20 can be a substrate, which will interact or react with the gas and/or with the elements present in said gas, on the side that is inside the chamber. The carrier panel 20 may also be formed by the substrate itself. In this case, the inner chamber 12 of the reactor 10 is delimited by the base panel 24, the top panel 26, the substrate surface 28, and the longitudinal boundary panel 30, with the corresponding panels 16, 18, 20, 22 being indicated in the sketch.

A gas intake or inlet port 32 and a gas exhaust or outlet port 34 are located in the top panel 18. The intake port 32 is positioned near the longitudinal side panel 22, and the outlet port 34 is near the substrate surface 28.

In accordance with the invention, the reactor 10 is tilted from vertical or horizontal 36, such that the substrate surface 28 is at an angle α from vertical, with this angle preferably ranging between 0° and nearly 90°. In other words, the reactor 10 describes an angle β from horizontal, wherein $0° < \beta \leq 90°$.

Figure 2:
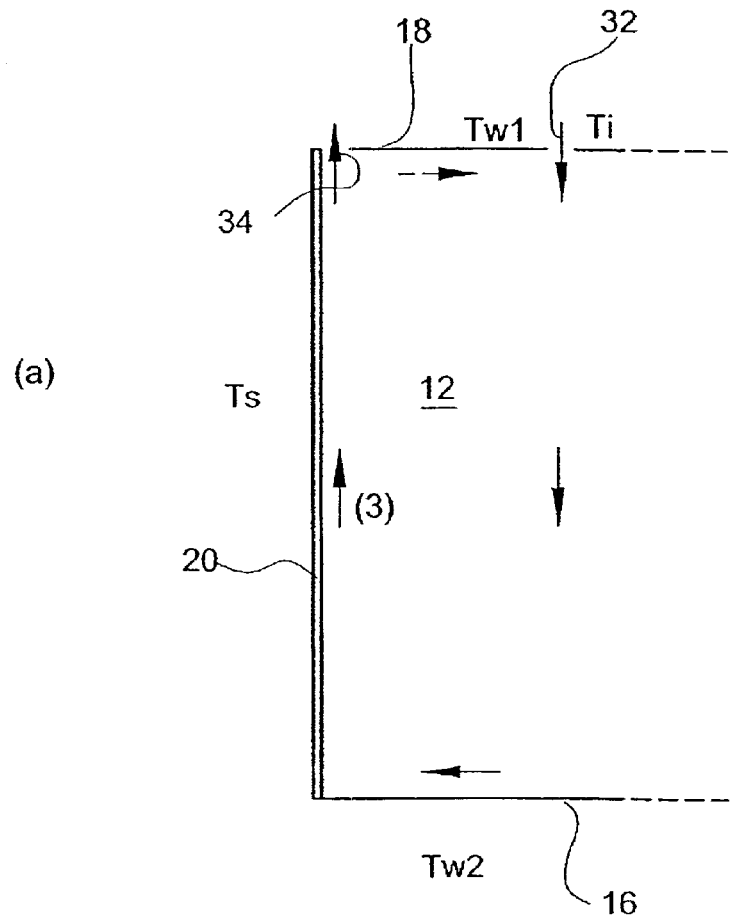
Figure 2:
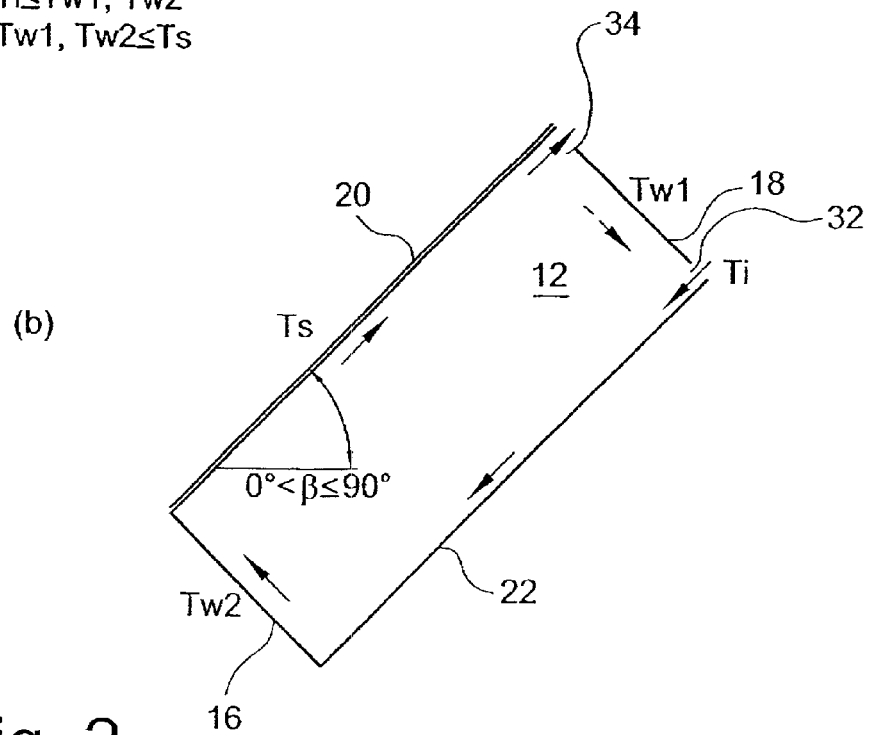
Figure 3:
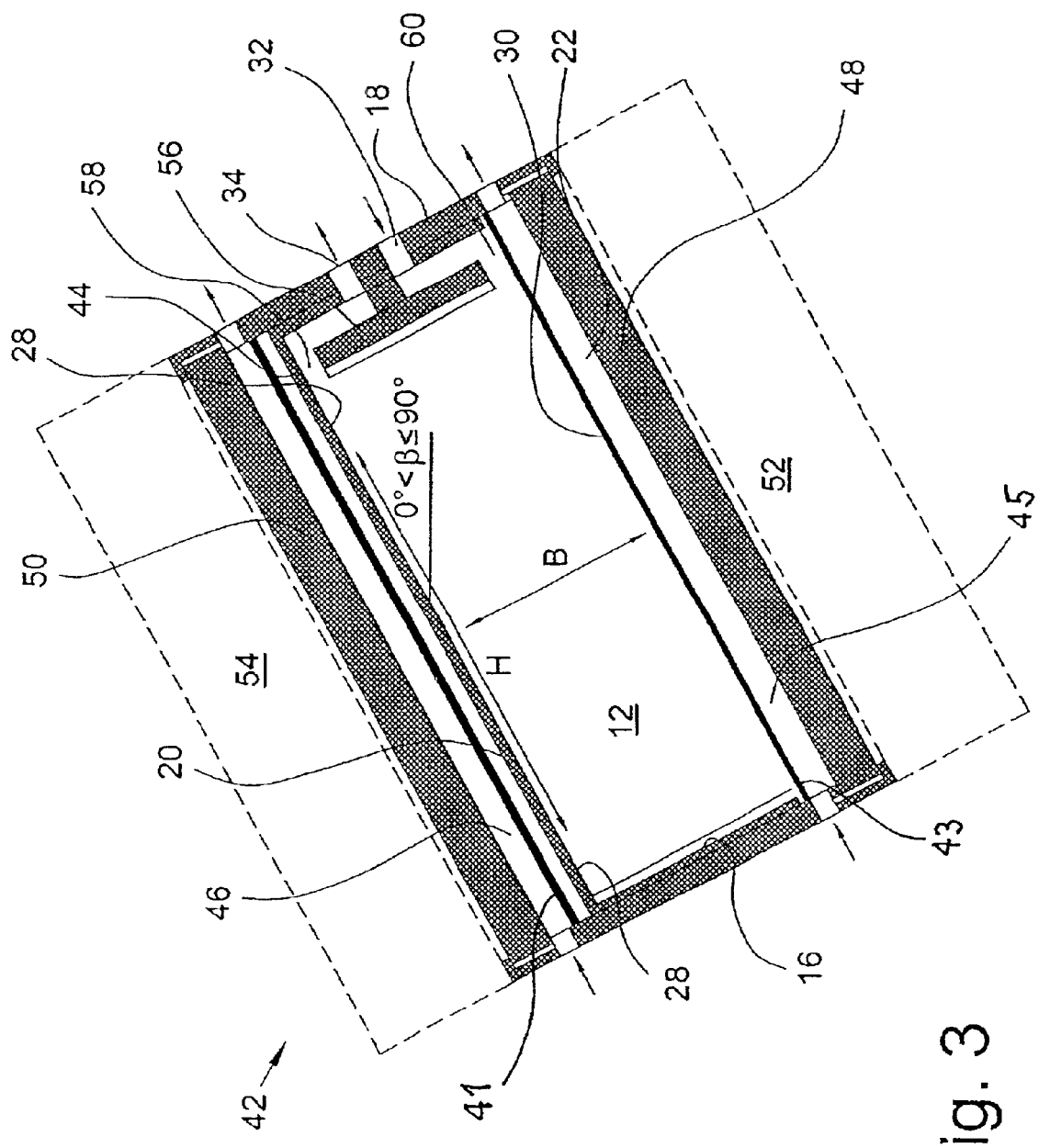

Various angles of inclination for the reactor 10 are illustrated in principle in FIGS. 2 and 3.

Preferably cold gas enters the reactor's inner chamber 12 through the intake port 32, flowing along the longitudinal panels or boundary panel 30 by force of gravity, until it reaches the base panel 24, at which point the gas flow is turned and directed toward the surface of the substrate 28, along which it then flows. The outlet port 34 is positioned a certain distance from the surface of the substrate 28, or extends from said surface, such that only that portion of the gas that has interacted with the substrate surface 28, or that contains elements that have interacted with the substrate surface, is removed from the chamber; in other words, that portion of the gas from which, in the case of a coating, the elements have already been deposited on the surface of the substrate 28 is removed from the chamber. Because the surface of the substrate 28 and/or the substrate has/have been heated to a temperature $T_3$, which is higher than the intake temperature $T_1$ of the gas, the gas becomes heated as it flows along the longitudinal boundary panel 30 and the base panel 24, with the result that the gas flows along the substrate surface by force of convection, in a laminar flow. As a result, a layer of gas 38 forms along the substrate surface 28 in the area near the substrate surface or in the coating area 40 if a coating is being applied to the substrate surface 28, which is depleted of the elements that have been deposited on the substrate surface 28. The gas in this coating area 40—also referred to as a zone—is drawn off via the outlet port 34, while the portion of gas that remains outside the coating zone 40, in which the concentration of elements that could become deposited on the substrate surface 28, continues to correspond approximately in its composition to that of the gas flowing into the chamber via the inlet port 32.

As is clearly indicated by the arrows in FIGS. 1 and 2, the gas flowing through the reaction chamber 12 forms a convection current, resulting in a laminar flow along the surface of the substrate 28.

Because the substrate and/or substrate surface 28 is positioned above the gas flow, larger particles are prevented from reaching the substrate surface 28 being coated. Further advantages are gained by the fact that the temperature of the substrate is at least equal to, but preferably higher than, the temperature of the remaining panels 16, 18, 20, and higher than the gas entering via the intake port 32. The positioning of the substrate above the reaction gas effects a temperature distribution that will ensure a stable gas flow, thus ensuring the desired laminar flow along the surface of the substrate 28.

In other words, in order to achieve a homogeneous deposition rate in a coating process, the property of convective flow is carefully utilized. The same applies if the surface is to be treated, as with the removal of layers from a substrate.

The gas that is fed in via the intake port 32 is cool, and preferably flows by force of gravity along the longitudinal boundary surface 30 to the base. Accordingly, the longitudinal side panel 22 and thus the reactor 10 should be tilted. In this, the angle of inclination a from vertical preferably ranges between 0° and 80°, or the angle of tilt β from horizontal ranges between 90° and 10°.

As the gas flows along the longitudinal boundary panel 30, it is gradually heated. The gas is then turned along the base panel 24, finally flowing upward toward the top panel, along the surface of the substrate 28, by force of convection. Thus, the gas flows along the substrate surface 28 only after it has been heated. As the gas flows along the hot substrate, it is heated within a zone measuring a few cm to 10 cm in width, which forms the lift and the force that create the convection current. Because of this, the hot gas will flow closely along the substrate surface 28, causing a chemical reaction to occur near the surface of the substrate 28. This provides advantages with respect to coating rate and yield. The tilt of the substrate supports the flow, with the flow rate increasing with a greater angle of inclination.

It should also be noted that the temperature of the gas flowing along the substrate continues to increase, hence the flow rate continues to increase. This serves to compensate for the depletion effect.

As was mentioned above, the gas outlet port 34 is positioned immediately adjacent to the substrate surface 28, with a slot-shaped geometry that extends parallel to the substrate surface 28. With this design, used gas can be removed from the chamber immediately after flowing along the substrate surface 28. The width of the outlet port 34 or the outlet slot or its distance from the substrate surface 28 are such that only gas that is depleted in terms of its nutrient components is drawn off. Thus, that portion of the gas that has flowed along the substrate and/or the substrate surface 28 at a greater distance, and thus is unused and preheated, will flow along the top panel 26 to the intake port 32, where it will be mixed with new gas being introduced into the chamber. This results in an increase in yield. At the same time, the concentration gradient along the surface of the substrate 28 is reduced.

The opening of the slot in the outlet port 34 should be wide enough to allow the layer of gas that flows along the surface of the substrate 28, and corresponds to the diffusion zone of the elements that interact with the surface of the substrate 28, to be drawn out of the chamber.

This process is illustrated in principle in FIG. 1. Here, the coating zone 40, or the layer in which the gas that flows through the reaction chamber 12 becomes depleted of its nutrient components, is drawn off via the outlet port 34. The remaining portion is recycled, in other words it continues to flow with the convection current.

The recycling of the unused gas helps to create a largely homogeneous gas mixture in the inner reaction chamber 12, prior to the coating zone 40 or the diffusion zone. Unused material is constantly recycled, resulting in a homogenization of the deposition rate. At the same time, the gas at least in the area of the base panel 16 or the substrate surface 28 is heated sufficiently to prevent a zone of "reduced reaction rate" from developing. In some cases, the gas in the area of the substrate surface 28 is also additionally heated in order to generate an even temperature profile that will ensure a laminar flow in the diffusion layer or the coating zone 40.

FIG. 3 shows a system 42, in which a silicon film is to be deposited on a substrate 44. In this, the system 42 corresponds in principle to the device shown in FIG. 1, hence similar elements are indicated by the same reference numbers.

In contrast to the embodiment illustrated in FIG. 1, FIG. 3 comprises a dual-panel structure made of quartz plates 41, 43 for the purpose of sealing the inner reaction chamber 12. The interspace between the quartz plate 41 of the longitudinal side panel 22 and an outer quartz glass panel 48 forms a channel 45, through which an inert gas such as $N_2$ gas may flow. By scouring the interspace, the quartz plate 43 is kept free from any incrustation caused by the reaction product from the inner reaction chamber 12. Furthermore, a cooling channel 46 extends at the back, along the substrate 44, through which a gas, such as $N_2$ gas, may also flow. The cooling channel 46 is bordered on the outside by the quartz plate 43. Quartz glass panels 48, 50, which can be penetrated by infrared or thermal radiation, extend along the longitudinal side panel 22 or the substrate 40. In addition, heat sources 52, 54, e.g. in the form of lamps, may be positioned along the quartz glass panels 48, 50. The base panel 16 and the top panel 18 may be made of special steel.

The substrate 44 can be heated via the heat sources 52, 54 to 900° C. to 1600° C. The radiation permeates through the quartz glass panels 48, 50 into the inner reaction chamber 12. The cold gas flowing in the cooling channels 44, 46 cools the quartz glass panels 48, 50, also referred to as window panels, to less than 900° C. The inner reaction chamber 12 is lined with quartz glass, with the upper surface—to the left in the figure—being formed by the surface of the substrate 28. In addition, the substrate 44 can be held in a corresponding mounting device within the inner reaction chamber 12. It is also possible for the substrate 44 to be shifted into and out of the plane of projection, allowing a silicon layer to be applied to the substrate in a quasi-continuous operation.

In the layering process, gas comprising a mixture of hydrogen (ca. 20 to 2000 slm) and trichlorosilane (ca. 1 to 200 slm) at atmospheric pressure is introduced into the inner reaction chamber 12 via the intake port 32.

As is apparent in FIG. 3, the arrangement of the intake port 32 and/or the outlet port 34 deviates from the device 10 shown in FIG. 1. Here, the intake port 32 and the outlet port 34 are positioned below a deflecting panel 56, which extends along the top panel 18. The deflecting panel 56 extends along the top panel 18, forming a gap 58, 60 formed on the side of the substrate or the side of the longitudinal boundary panel, with this gap in dimension and positioning 10 to the intake port 32 or outlet port 34, respectively, as shown in FIG. 1. Once again, only that portion of gas that flows directly along the surface of the substrate 28 and is depleted of the nutrient components, is drawn out of the inner reaction chamber 12.

It should further be noted that the pressure inside the inner reaction chamber 12 may be somewhat higher than that of the surrounding atmosphere.

Below, additional exemplary embodiments will be used to further clarify the teaching of the invention.

1. CVD Deposition of an Si Film Over a Large-Area Substrate

First, a substrate 44 that is preferably comprised of graphite or of a ceramic that may contain graphic, or that contains graphite, is directed through the inner reaction chamber 12 as illustrated in FIG. 3, during which time it is heated to temperatures of ca. 1000° C. to 1200° C. Cold reaction gas comprised of trichlorosilane and $H_2$ is fed via the gas intake port 32 and the gap 60 into the inner reaction chamber 12, flowing along the longitudinal boundary panel 30. Because the gas is heated as it flows along the longitudinal boundary panel 30 and the base panel 16, thus gaining lift, convection is created in the inner reaction chamber 12; this causes the gas to flow along the surface of the substrate 28, depositing a silicon film on the substrate 44.

The height H of the inner reaction chamber 12 in this example is approximately 400 mm, and the width B of the inner reaction chamber 12 is approximately 200 mm.

In the reaction, gas is consumed within a narrow zone that corresponds to the coating zone 40. Gas in this zone, which is ca. 1 to 2 cm wide and is under standard pressure, is drawn off via the outlet gap 56 at the top of the substrate, wherein the width of the gap can be adjusted to correspond to the width of the zone of the reacting gas. The tilted positioning of the substrate 44 prevents a turbulent flow and a thorough mixing of unused and used gas, allowing undesired products to easily escape.

The area below the zone (coating zone 40) contains the unused gas, which is turned toward the longitudinal boundary panel 40 by the deflecting panel 56. At the same time a cooling occurs along the deflecting panel 58, so that when the unused gas is additionally mixed with cold, fresh gas, introduced into the inner reaction chamber 12 via the intake port 32 and/or the gap 60, the gas will "drop" by force of gravity along the longitudinal boundary panel 30. The cycle is then repeated, i.e. the convection current formed in the reaction chamber 12 causes unused gas to be directed along the surface of the substrate 28, depositing the desired silicon film on the surface of the substrate 28.

Figure 4:
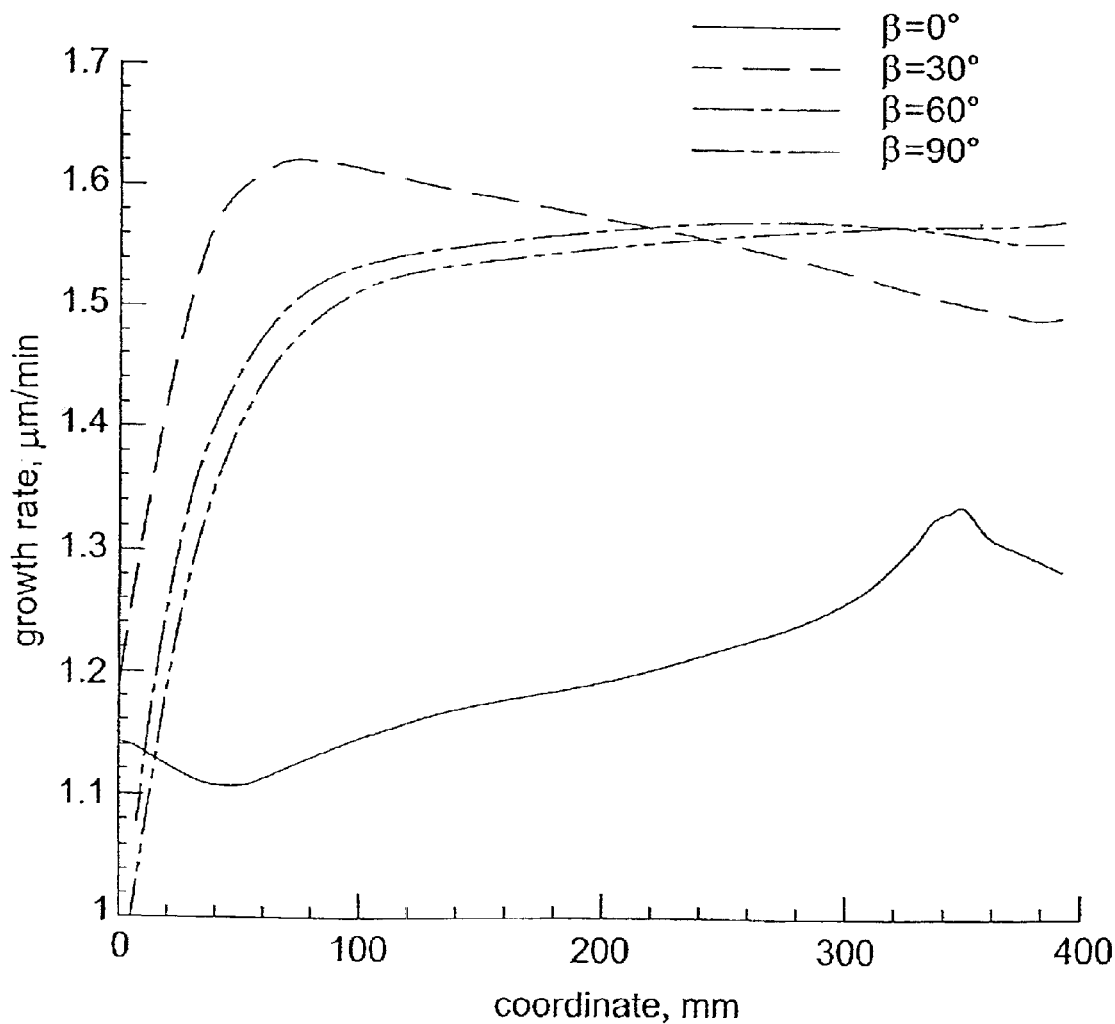

The constant renewal of the gas creates an area with a very homogeneous concentration in the area prior to the coating zone 40, ensuring a homogeneous deposition rate over the entire substrate surface 28. Tests have shown that the deposition rate will remain stable and independent of the angle of inclination β within broad parameters. The angle D preferably measures between 10° and 90°, and is especially homogeneous within the range of $60° \leq \beta \leq 90°$, as is illustrated clearly in FIG. 4. Thus stable coating rates, i.e. those that are relatively independent of the angle of inclination, can be achieved within this angle range.

Thus, the deposition rate in μm per min. is applied at a distance from the base-side edge of the substrate 44, dependent upon the angle of tilt β from horizontal. In this case, the substrate 44 measures 400 mm in length, which corresponds to the distance between the base panel 16 and the top panel 18. Obviously, only a small distance from the base panel 16 the deposition rate becomes nearly constant. Only in the case of an angle of tilt β of 0° is it impossible for a convection current to develop, resulting in instability.

The substrate 44, coated as in the example described above, thus possesses a homogeneous film, with the exception of an area along the base edge, measuring, for example, 100 mm in length (start of the CVD deposition).

2. CVD Deposition of a Semiconductor-Layer System for a Si Thin-Film Solar Cell.

Figure 5:
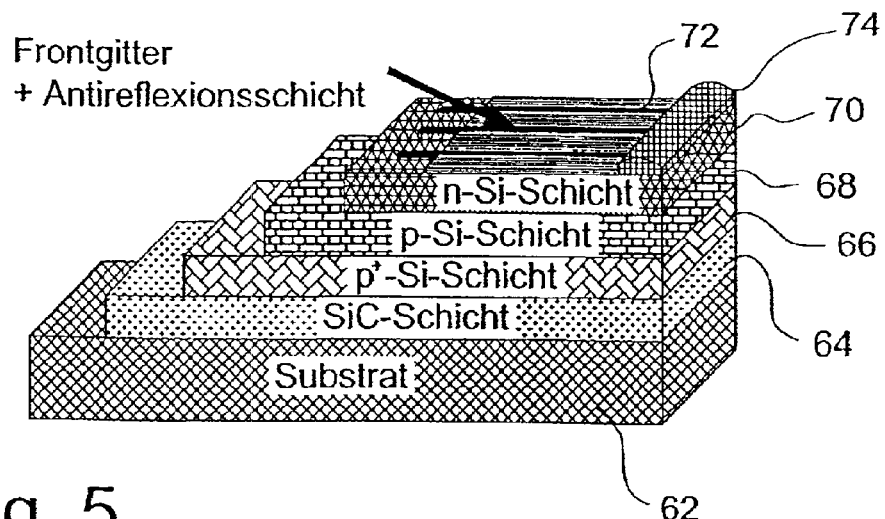

With the method specified in the invention and/or the corresponding device, a semiconductor layer system for a crystalline silicon thin-film solar cell can be produced, as is illustrated in principle in FIG. 5. The system of layers is comprised of a substrate 62 that is preferably comprised of graphite or of a ceramic that contains graphite, or that contains graphite. The base of the system of layers is formed by the substrate 62, an electrically conductive SiC rear contact layer 64, or alternatively an electrically insulating intermediate layer in the case of an integrated, interconnected thin-film solar module, a heavily doped silicon nucleation layer 66 having a coarse-crystalline particle structure, and a photosensitive silicon layer 68 that is epitaxially deposited on the nucleation layer. With this type of coating system, the types of solar cells known in crystalline silicon technology can be produced, with both MIS-inversion film solar cells and solar cells with a pn-transition being successfully used as test structures. For example, FIG. 5 shows a solar cell with a pn-transition, in other words one with the emitter 70 diffused with a broader sandwich structure, a metallic front lattice 72, and an antireflection film 74.

In producing the system of layers as illustrated in FIG. 5, the following process sequence is implemented, in accordance with the teaching of the invention:

Production of the substrate,

CVD deposition of an intermediate layer (SiC or silicon nitride or a mixture of the two components), CVD deposition of a $p^+$-Si nucleation layer, Application of a $SiO_x$ surface film, Crystallization of the $p^+$-Si nucleation layer, Removal of the $SiO_x$ surface film, Epitaxy (CVD) of the photovoltaically active Si layer, Solar cell structures (for example MIS-IL processes, pn processes).

The processes are implemented in detail as follows:

a) Intermediate Layer

A substrate having an edge length of preferably 100 mm to 1000 mm, preferably between 300 mm and 500 mm, which is preferably comprised of graphite, or contains graphite, or is comprised of a ceramic that may contain graphite, is heated to a substrate temperature of ca. 1300° C. to 1600° C. During the heating process, a portion of the reaction gas, comprised of methyl trichlorosilane and $H_2$, is introduced into the inner reaction chamber 12 via the gas intake port 32, 60. In accordance with the mechanism described above, a convection current forms, coupled with a diffusion zone (coating zone 40) and a zone of circulating, unused gas. In this manner, the SiC film 64 is deposited on the substrate 62.

The addition of small quantities of nitrogen allows an electrically conductive, nitrogen-doped SiC intermediate film to be generated. The layer thickness is between 1 μm and 100 μm, preferably between 30 μm and 50 μm.

If the substrate is heated to 1200° C., and the reaction gas, comprised of a chlorosilane and $NH_3$, is introduced at a partial vacuum of 40 to 100 mbar below atmospheric pressure, then a layer of silicon nitride will be deposited. From the combination of the two materials, a mixture of coating materials containing SiC and silicon nitride can be produced in a partial vacuum. The layers (SiC, silicon nitride, or a mixture of these materials) form an electrically insulating intermediate layer and a barrier to impurities. SiC that is doped with nitrogen can be used to generate an electrically conductive intermediate layer. The layer thickness is between 1 μm and 100 μm, preferably 30 μm and 50 μm.

b) Nucleation Layer

An Si film (p⁺-Si) that is heavily doped with boron is deposited on the above-described SiC intermediate layer 64. In this, the above-mentioned temperature and gas flow parameters are used. The temperature of the substrate should be ca. 1000° C. to 1200° C., preferably 1100° C. The reaction gas is comprised of trichlorosilane and $H_2$, admixed with $BCl_3$. The layer produced in this manner is between 1 μm and 100 μm thick, preferably between 30 μm and 50 μm.

The p⁺-Si layer CVD deposited in the inner reaction chamber 12 is covered with a silicon oxide or silicon nitride film that is 0.1 μm to _5 μm, preferably 2 μm, thick. The heavily doped Si film is then melted on outside the reaction chamber, and is laterally crystallized in a zone-melting process (ZMR=zone melting and recrystallization), wherein particle sizes of several hundred μm to into the cm range can be achieved. The crystallized film forms the nucleation layer 66. The surface film prevents the melt from drawing together to form droplets.

Following crystallization, the silicon oxide or silicon nitride film is removed via etching. This may also be performed within the inner reaction chamber 12.

c) Photovoltaically Active Si Layer

An Si film 68 doped with ca. $1 \cdot 10^{16}$ to $1 \cdot 10^{17}$ cm⁻³ boron is epitaxially deposited on the crystalline nucleation layer 66 produced as described above. This may also be performed inside the inner reaction chamber 12. The Si film 68 forms the photovoltaically active layer as the basis for a thin-film solar cell. The epitaxial layer 68 is between 2 μm and 100 μm thick, preferably between 15 μm and 30 μm. If the layer is less than 15 μm thick, adequate reflection of the light on the rear side of the epitaxial layer is essential in order to achieve a high level of efficiency.

d) Solar Cell Processes

To produce a solar cell, a ca. 0.1-μm to 0.5-μm thick phosphorous-doped Si film 70 is diffused inward on the above-described system of layers 62, 64, 66, 68. A front lattice 72 or transparent electrode, and a ca. 80-nm-thick antireflective film 74 comprised of $TiO_2$/MgF or SiN, etc. are applied to this. In this manner, a thin-film solar cell, which is illustrated in principle in FIG. 5, is created. If an insulating substrate 62 is used, or if at least the layer 64 is electrically insulating, the solar cell can be integrated and interconnected.

What is claimed:

1. Method for treating and/or coating a surface of an object by contact with a gas, comprising the steps of:
   directing the gas into a coating chamber comprising a first longitudinal boundary panel, a base panel, a second longitudinal boundary panel comprising the surface of the object which is substantially parallel to the first longitudinal boundary panel, and a top panel, the first and second longitudinal boundary panels being oriented at an angle α from vertical,
   causing the gas to flow in the chamber in the form of a convection current which flows along the first longitudinal boundary panel by gravity, and in a substantially laminar flow along the surface of the object,
   heating the gas along the first longitudinal boundary panel and/or the base panel, and
   withdrawing a portion of the gas which flows along the surface of the object from the chamber, and recycling a portion of the gas which flows along the surface of the object within the chamber.

2. Method in accordance with claim 1, wherein the surface of the object or the object itself is heated by infrared radiation, microwaves or inductively.

3. Method in accordance with claim 1, wherein the gas comprises $SiHCl_3$ and $H_2$, causing deposit of a silicon film on the surface of the object.

4. Method in accordance with claim 1, wherein a Cu—In—Ga film is deposited on the surface of the object which is a glass substrate, followed by directing a gas containing $H_2Se$ the film to form a $CuInGaSe_2$ layer on the glass substrate.

5. Method in accordance with claim 1, wherein a Cu—In—Ga film is deposited on the surface of the object which is a glass substrate, followed by directing a gas containing $H_2S$ along the film to form a $CuInGaS_2$ layer on the glass substrate.

6. Method in accordance with claim 1, wherein the gas comprises tin tetrachloride and $H_2O$, and is directed along a glass substrate to form a tin oxide layer.

7. Method in accordance with claim 1, wherein the gas comprises silicon tetrachloride and $H_2O$, and is directed along a glass substrate to form a silicon oxide film.

8. Method in accordance with claim 1, wherein the gas comprises $POCl_3$, and is directed along a silicon layer to form a phosphorous glass layer, which is tempered for inward diffusion of phosphorous.

9. Method in accordance with claim 1, wherein the surface of the object or a film deposited on the surface is removed by causing a gas containing HCl to flow along the surface of the film.

10. Method in accordance with claim 1, wherein the surface of the object or a film applied to this surface is removed by causing a gas containing HF to flow along the surface or the film.

11. Method in accordance with 1, wherein a silicon oxide film is removed from the surface of the object by causing a gas containing HF and/or $H_2O$ to flow along the surface.

12. Method in accordance with claim 1, wherein, a silicon oxide film is removed from the surface of the object by causing a gas containing $H_2$ at a temperature T≧1000° C. to flow along the surface.

13. Method in accordance with claim 1, wherein the object is treated to become a semiconductor component or solar cell.

14. Method in accordance with claim 1, wherein 0°≦α<90°.

15. Method in accordance with claim 14, wherein 0°≦α≦60°.

16. Method in accordance with claim 1, wherein the gas comprises $CH_3SiCl_3$ and $H_2$ and/or $NH_3$, or $SiH_2Cl_2$, $SiHCl_3$, $SiCl_4$ and $H_2$ and/or $NH_3$, causing deposit on the surface of the object of a film containing silicon carbide and/or silicon nitride.

17. Method in accordance with claim 16, wherein the gas additionally comprises a doping gas selected from the group consisting of diborane, boron trichloride, aluminum trichioride arid gallium chloride.

18. Method in accordance with claim 1 for producing a semiconductor system of layers, wherein the object comprises a substrate selected from the group consisting of silicon, ceramic or graphite, and wherein:
   a first layer containing SiC and/or silicon nitride is deposited via CVD onto the surface of the object, at a substrate temperature of 900° to 2000° C.;

a silicon film (p⁺) that is doped with an element from Group III of the periodic table is applied to the first layer, followed by crystallization via melting; and a photosensitive silicon film is applied epitaxially to crystallized areas within a range of between 0.1 mm and 10 mm.

19. Method in accordance with claim 18, additionally comprising forming a pn transition on the epitaxial silicon film.

20. Method in accordance with claim 18, additionally comprising forming a front contact layer and optionally an antireflective layer.

21. Method in accordance with claim 18, additionally comprising applying a 0.1 μm to 5 μm thick initial silicon oxide film prior to the melting on of the silicon film that is doped with an element from Group III of the periodic table, which initial silicon film is recrystallized by melting, and is doped and etched away via a gas containing HF and/or $H_2$, in order to form a nucleation layer having a multicrystalline structure, whose particles extend between 0.1–10 mm.

22. Method in accordance with claim 1, wherein the chamber is substantially cuboid.

23. Method in accordance with claim 22, wherein the gas is introduced into the chamber at a temperature $T_1$, which is lower than the temperature $T_2$ of the surface of the objet to be treated or coated.

24. Method in accordance with claim 22, wherein the portion of the gas that is drawn out of the chamber has a layer thickness that is less than three times the width of a diffusion zone in which the gas interacts with the surface of the object.

25. Method in accordance with claim 24, wherein the portion of the gas that is drawn out of the chamber has a layer thickness that is approximately the width of the diffusion zone.

26. Method in accordance with claim 22, wherein the first longitudinal boundary panel of the chamber is cooled.

27. Method in accordance with claim 22, wherein the gas is introduced in the top of the chamber at a temperature that causes the gas to flow along the longitudinal boundary panel by force of gravity.

* * * * *